US006328841B1

(12) United States Patent
Klumpp et al.

(10) Patent No.: US 6,328,841 B1
(45) Date of Patent: Dec. 11, 2001

(54) PROCESS FOR JOINING INORGANIC SUBSTRATES IN A PERMANENT MANNER

(75) Inventors: Armin Klumpp; Christof Landesberger, both of München (DE)

(73) Assignee: Fraunhofer-Gesellschaft zur Foerderungdder Angewandten Forschung, e.V., Munich (DE)

(*) Notice: Subject to any disclaimer, the term of this patent is extended or adjusted under 35 U.S.C. 154(b) by 0 days.

(21) Appl. No.: 09/269,391

(22) PCT Filed: Sep. 24, 1997

(86) PCT No.: PCT/EP97/05253

§ 371 Date: Nov. 5, 1999

§ 102(e) Date: Nov. 5, 1999

(87) PCT Pub. No.: WO98/13860

PCT Pub. Date: Apr. 2, 1998

(30) Foreign Application Priority Data

Sep. 26, 1996 (DE) .............................................. 196 39 682

(51) Int. Cl.$^7$ ...................................................... B32B 31/12
(52) U.S. Cl. .................................. 156/272.6; 156/273.3; 156/274.4; 427/533; 427/535; 427/569
(58) Field of Search ............................. 156/272.2, 272.6, 156/273.3, 274.4, 274.6; 427/533, 535, 536, 569, 570, 578, 579, 582, 583

(56) References Cited

U.S. PATENT DOCUMENTS 5,019,210 * 5/1991 Chou et al. ........................... 156/643
5,178,962 * 1/1993 Miyamoto et al. .................... 428/463
5,357,005 * 10/1994 Buchwalter et al. .................. 525/436
5,427,638 * 6/1995 Goetz et al. ........................... 156/153
5,503,704 * 4/1996 Bower et al. .......................... 156/281

FOREIGN PATENT DOCUMENTS 4404931  8/1994 (DE) .............................. H01L/21/58

OTHER PUBLICATIONS

Den Besten et al., "Polymer Bonding of Micro–Machined Silicon Structures," MESA Research Institute, Univ. of Twente, Micro Electro Mechanical Systems '92, Travemunde (Germany), Feb. 4–7, 1992, pp. 104–109.

Spierings et al, "Direct Bonding of Organic Polymeric Materials," Philips J. Res. 49 (1995) 139–149.

* cited by examiner

Primary Examiner—Michael W. Ball
Assistant Examiner—Jessica Rossi
(74) Attorney, Agent, or Firm—Michael A. Glenn

(57) ABSTRACT

In a method of connecting a first and a second silicon wafer, the first silicon wafer is first provided with a polyimide layer on a main surface thereof. Subsequently, a plasma-induced reaction between the polyimide layer and water is performed. A plasma-induced reaction is also performed between a main surface of the second silicon wafer and chlorine. The main surface of the second silicon wafer is then subjected to a treatment with hydrolyzed triethoxysilylpropanamine. Following this, the surfaces of the two silicon wafers, which have been subjected to the plasma-induced reactions, are joined together so as connect the silicon wafers permanently.

16 Claims, 1 Drawing Sheet

PROCESS FOR JOINING INORGANIC SUBSTRATES IN A PERMANENT MANNER

FIELD OF THE INVENTION

The present invention relates to a method of permanently connecting inorganic substrates and, in particular, to a method of connecting a first and a second silicon wafer by means of a polyimide layer.

DESCRIPTION OF BACKGROUND ART

In the field of microelectronics, future applications require not only an increase in the computing performance or in the storage capacity of an IC component (IC=integrated circuit) but also an extension of the functionality thereof. Such an extension of functionality comprises e.g. the possibility of combining sensor technology, data processing and data storage on one chip component, e.g. for a CCD chip (CCD=charge coupled device), which is integrated directly on one logic level for evaluating and reducing large amounts of data. Starting from the planar standard CMOS technology, efforts concerning the development of a vertical connection technique are therefore increasingly made so as to fulfill the future system requirements in the field of microelectronics.

The desired option, viz. that also wafers with sensitive surface structures can vertically be integrated with a second wafer, makes it necessary to possess a connection technique permitting a wafer bottom and a wafer top to be placed one on top of the other, i.e. to be permanently connected. In the field of technology, it is known to connect surfaces of bodies, which consist of plasma oxide, thermal oxide and silicon, with polyimide.

The only material that can be used for a CMOS-compatible electric connection of two mechanically connected wafers is tungsten which is deposited in a CVD process (CVD=chemical vapour deposition) from the gaseous phase ($WF_6$) at 400 to 450° C. This deposition of tungsten can only be carried out after the mechanical connection of the two wafers. This means, in turn, that for the mechanical connection of the wafers a method must be found which provides a mechanical connection of said wafers that is capable of resisting temperatures of up to 450° C.

Conventional adhesive materials are not suitable for establishing a connection of the above-mentioned kind, which is capable of resisting temperatures of up to 450° C., since said materials are not sufficiently temperature stable. Furthermore, conventional adhesive materials cannot be applied to the wafers with the necessary homogeneity in the range of from approx. 1 to 3 $\mu$m thickness. The temperature requirement prevents the use of organic adhesives, the homogeneity requirement prevents the use of mineral-matter-filled, inorganic adhesives for establishing a permanent mechanical connection between two wafers.

DESCRIPTION OF PRIOR ART

The article "DIRECT BONDING OF ORGANIC POLYMERIC MATERIALS", SPIERINGS G.A.C.M. et al, in Philips J. Res. 49 (1995), pp. 139–149, discloses connection methods, e.g. for connecting a silicon layer with a polyimide layer, in the case of which an originally hydrophobic polyimide layer is rendered hydrophilic by means of a surface treatment, whereupon it is connected to a silicon wafer.

DE-A-4404931 discloses a method and devices for directly connecting two bodies. A reactive gas, such as oxygen and hydrogen is used for forming hydroxide groups on at least one surface of two bodies connected, according to the method and devices described. DE-A-4404931 mentions, by way of example, polyimide, SiO2 or silicon as bodies to be connected.

In Den Besten C. et al, "Polymer Bonding of Micro-Machined Silicon Structures", Proceedings of the Workshop on Micro Electro Mechanical Systems '92, Travemunde, Feb. 4 to 7, 1992, (No. Workshop 5, Feb. 4, 1992, Benecke W., Petzold H.-C., pp. 104–109, XP000344134) different ways of connecting silicon wafers are described. One possibility described is a direct connection between silicon and silicon, which is based on a chemical reaction between OH groups existing on the surface of $SiO_2$. Such connection methods are carried out at 200° C. to 300° C. A further connection mode described in the above-mentioned publication is indirect bonding in the case of which an intermediate layer of glass containing sodium or an intermediate layer of boron glass is used. Furthermore, the use of an intermediate layer of metal for carrying out eutectic bonding is described. The above-mentioned publication additionally discloses a method of indirectly connecting two silicon wafers in the case of which a negative photoresist, a polyimide or an epoxide is used for connecting two silicon wafers indirectly.

Starting from the above-mentioned prior art, it is the object of the present invention to provide a method for permanently connecting two silicon wafers, the connection area being capable of resisting temperatures of up to 500° C. and showing the demanded homogeneity.

This object is achieved by methods of connecting a first and a second silicon wafer according to claims 1 and 4.

The present invention provides a method of permanently connecting silicon wafers making use of a polyimide layer which is subjected to a separate surface modification prior to the connection operation. Such a polyimide layer allows a wafer bonding process (wafer bonding=establishing an atomic connection between solids) permitting at bonding temperatures of less than 450° C. a stable and, in particular, a blister-free wafer connection. The connection area of two wafers, which are connected by means of a surface-modified polyimide layer, shows a greatly increased tensile strength in comparison with the interface of a conventional polyimide connection.

According to a first embodiment of the present invention, a first silicon wafer is first provided with a polyimide layer on a main surface thereof. Subsequently, a plasma-induced reaction is caused to take place between the polyimide layer and water so as to make the surface of the polyimide hydrophilic. In addition, a plasma-induced reaction is also caused to take place between a main surface of a second silicon wafer, which is to be connected to the first silicon wafer, and chlorine so as to make the main surface of the second silicon wafer hydrophilic. The main surface of the second silicon wafer, which is to be connected to the first silicon wafer, is then treated with hydrolyzed triethoxysilylpropanamine. Subsequently, the first and the second silicon wafer are joined together, whereby the main surfaces thereof are connected.

According to a further embodiment, an $SiO_2$ layer is formed on the main surface of the second silicon wafer which is to be connected to the first silicon wafer. This $SiO_2$ layer is treated with hydrolyzed triethoxysilylpropanamine. The treated $SiO_2$ layer is then either connected directly to the surface-modified polyimide layer or subjected to a plasma-induced reaction with chlorine prior to being connected.

Further developments of the present invention are disclosed in the dependent claims.

Preferred embodiments of the present invention will be explained in detail in the following, part of said explanations referring to the drawings enclosed in which:

FIG. 1 shows schematically a set-up for carrying out a tensile test for two interconnected wafers; and FIG. 2 shows a "tear-off spectrum" as a result of the tensile test which is schematically shown in FIG. 1.

In the following, the designation "bonding" constituting the basis of the connection method according to the present invention will be explained. The designation "bonding", which is used in German in the same way, is used for referring to connections established via a chemical reaction resulting in covalent bonds. This connection technique clearly differs from connection techniques in the case of which much weaker bonds are produced by means of adhesive joining. The connection established by "bonding" does normally not comprise an adhesive body, which may be the limiting factor due to its material-dependent stability under temperature and tensile strain, but is a process, . . . .

The present invention provides a method of permanently connecting silicon wafers making use of a polyimide layer which is subjected to a separate surface modification prior to the connection operation. Such a polyimide layer allows a wafer bonding process (wafer bonding=establishing an atomic connection between solids) permitting at bonding temperatures of less than 450° C. a stable and, in particular, a blister-free wafer connection. The connection area of two wafers, which are connected by means of a surface-modified polyimide layer, shows a greatly increased tensile strength in comparison with the interface of a conventional polyimide connection.

According to a first embodiment of the present invention, a first silicon wafer is first provided with a polyimide layer on a main surface thereof. Subsequently, a plasma-induced reaction is caused to take place between the polyimide layer and water so as to make the surface of the polyimide hydrophile. In addition, a plasma-induced reaction is also caused to take place between a main surface of a second silicon wafer, which is to be connected to the first silicon wafer, and chlorine so as to make the main surface of the second silicon wafer hydrophile. The main surface of the second silicon wafer, which is to be connected to the first silicon wafer, is then treated with hydrolyzed triethoxysilylpropanamine. Subsequently, the first and the second silicon wafer are joined together, whereby the main surfaces thereof are connected.

According to a further embodiment, an $SiO_2$ layer is formed on the main surface of the second silicon wafer which is to be connected to the first silicon wafer. This $SiO_2$ layer is treated with hydrolyzed triethoxysilylpropanamine. The treated $Sio_2$ layer is then either connected directly to the surface-modified polyimide layer or subjected to a plasma-induced reaction with chlorine prior to being connected.

BRIEF DESCRIPTION OF THE DRAWINGS

Preferred embodiments of the present invention will be explained in detail in the following, part of said explanations referring to the drawings enclosed in which.

DETAILED DESCRIPTION OF PREFERRED EMBODIMENTS

Figure 1:
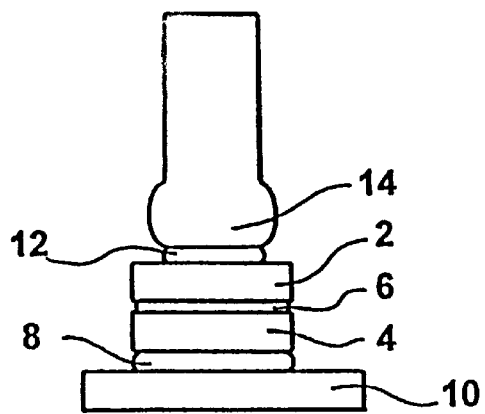
FIG. 1 shows schematically a set-up for carrying out a tensile test for two interconnected wafers.

In the following, the designation "bonding" constituting the basis of the connection method according to the present invention will be explained. The designation "bonding", which is used in German in the same way, is used for referring to connections established via a chemical reaction resulting in covalent bonds. This connection technique clearly differs from connection techniques in the case of which much weaker bonds are produced by means of adhesive joining. The connection established by "bonding" does normally not comprise an adhesive body, which may be the limiting factor due to its material-dependent stability under temperature and tensile strain, but is a process that takes place directly on the surface of the parts to be connected.

For establishing permanent connections an aim must therefore be to couple respective functional groups purposefully to the surfaces of two bodies to be connected. In so doing, the surfaces to be connected must have applied thereto the respective complementary reaction partners. When this is technically realized for connecting two wafers in the field of microelectronics, attention should be paid to the fact that the necessary process steps for modifying the surfaces to be connected are compatible with IC technology. In addition, it should be possible to use already existing equipment for the processing steps in an advantageous manner. Ideally, the modification processes should be applicable to all existing layer surfaces without any limitations.

The method according to the present invention for permanently connecting inorganic wafers is based on an approach to low-temperature bonding, viz. the condensation reaction of Si—OH groups with one another under abstraction of water, said condensation reaction being shown in formula (1):

$$2\ Si-OH \rightarrow Si-O-Si+H_2O \qquad (1)$$

Also the actual cross-linking reaction by means of which the polymer matrix of the polyimide is built up is a possible reaction that can be utilized for connecting the polyimide with other surfaces. A scheme of this cross-linking reaction is expressed in formula (2). Also this reaction is a condensation reaction; in this case, said reaction, however, takes place between OH and amino groups:

$$R^1-NH_2+R^2-COOH \rightarrow R^1-NH-CO-R^2+H_2O \qquad (2)$$

The parts designated by R can represent different surfaces, $R^1$ being e.g. a silicon surface and $R^2$ being e.g. a polyimide surface. Both reactions expressed by formulae (1) and (2) proceed as thermally-induced reactions below 400° C.

In the method according to the present invention, polyimide is only used in its fully cured form for connecting two wafers. For this purpose, the polyimide is cured completely (400° C.) after having been applied to the wafer surface e.g. by a spin-on process. Subsequently, all the functional groups of the polyimide which could be used for an adhesive process exist no longer. The surface of the completely cured polyimide layer must therefore be subjected to surface conditioning. This results either in a reactivation of the polyimide surface by a breakup of the polyimide rings located close to the surface or at least in the formation of OH groups. In both cases, one of the above-mentioned condensation reactions can then be used for connecting the polyimide surface to a silicon surface.

Plasma-induced reactions between the surfaces to be connected, with water, oxygen and chlorine as reactive media, have been examined as possible methods of treating the surfaces to be connected. The changed surface population, i.e. the result of the plasma-induced reactions, can be proved by measuring the contact angle of water before and after the respective treatments. Table 1 shows measuring results representing the contact angle of water in dependence upon the surface treatment of polyimide, $SiO_2$ and silicon. As can be seen from said table, it is water as a medium in the plasma that achieves the best hydrophilic properties of the surface in the case of polyimide, whereas in the case of silicon and $SiO_2$ chlorine gas is most suitable for rendering the surfaces hydrophilic. The table also shows that $SiO_2$ already shows a small contact angle without any plasma-induced reaction so that $SiO_2$ can be used for connection with a modified polyimide surface without any surface treatment of said $SiO_2$ being necessary.

TABLE 1 contact angle in dependence upon surface treatment

| material | contact angle α original surface | plasma $H_2O$ plasma plas. pot. | $O_2/H_2O$ plasma 100 VDC + $H_2O$ dip | $Cl_2$- 15 min, 30 VDC + $H_2O$ dip | HMDS T = 21° C. |
|---|---|---|---|---|---|
| polyimide | 63°–71° | 0°–31° | | | |
| PE-$SiO_2$ | 32° | 47° | 30° | <5° | 70° |
| silicon HF dip | 63° | | <5° | | |

The term PE-$SiO_2$ in the table stands for silicon dioxide deposited in a plasma-enhanced (PE=plasma enhanced) process. The terms $H_2O$ dip and HF dip stand for rinsing in deionized water and hydrofluoric acid, respectively. HMDS is hexamethyl disilazane. The term plas. pot. stands for plasma potential and the term VDC stands for V DC voltage.

The hydrophilic surfaces of silicon and $SiO_2$ can be treated with an adhesion promoter for polyimide, i.e. hydrolyzed triethoxysilylpropanamine, so as to provide the amino group according to the reaction of formula (2). A permanent connection between two wafers can be achieved in this way by means of an alternative method according to the present invention.

A further objective proof of the surface modification is the measurement of the stability of the resultant bonds. An experimental set-up for measuring the stability is shown in FIG. 1. An upper wafer 2 and a lower wafer 4 have been connected by a polyimide layer 6 by means of the method according to the present invention. The lower wafer 4 is secured to a ceramic board 10 by means of a ceramic adhesive 8. The upper wafer 2 is secured to a stamp 14 by means of a stamp adhesive 12. The ceramic board 10 and the stamp 14, which consists e.g. of aluminium, are part of a tear-off device, the so-called Sebastian-Viktor tester. For furnishing an objective proof of the surface modification, differently modified, polyimide-coated wafers were bonded, sawn into chips having a size of 5 mm×5 mm and then subjected to a tensile test in which the adhesive strength of the bonding sites was determined. The test carried out permits statements with regard to the adhesive strength of the bonding joint, if tearing off occurs at the bonding interface of the bonded chip, with regard to the lower limit value for the adhesive strength, if breaking occurs in the chip structure, explicitly not at the interface of the bonded chip, and with regard to the distribution of the adhesive strength over the wafer surface, whereby the homogeneity of the pretreatment and of the bonding process can be checked.

Figure 2:
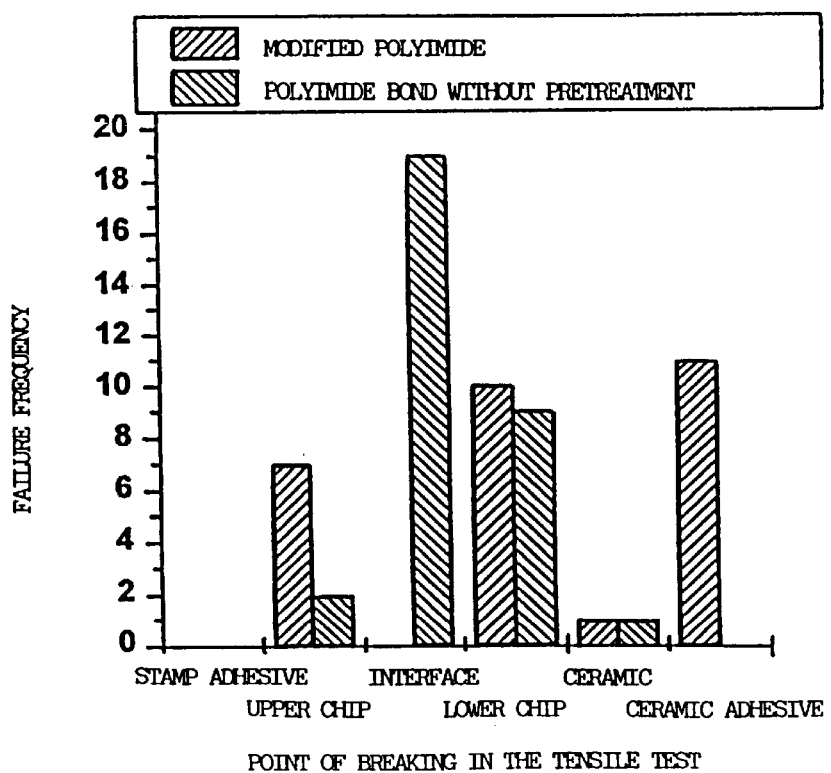
FIG. 2 shows a "tear-off spectrum" as a result of the tensile test which is schematically shown in FIG. 1.

In FIG. 2 the tear-off spectrum of a bonded wafer without surface modification of the surfaces to be connected is compared to that of a bonded wafer with surface modification of the surfaces to be connected. The stamp adhesive, the upper chip, the bonding joint, the lower chip, the ceramic and the ceramic adhesive are indicated as possible points of fracture. As can be seen from FIG. 2, the pretreatment enhances the bonding strength to such an extent that tearing off will only occur at the points where the wafers are secured to the stamp and the ceramic board or the silicon itself, but not at the bonding joint. In contrast to this, most of the failures occur directly at the bonding joint when polyimide bonding has been carried out without any pretreatment of the polyimide surface. Hence, the pretreatment according to the present invention provides a bonding joint whose tensile strength exceeds the mechanical strength of the silicon chip or of the ceramic support of the tear-off device used.

An optimum bonding joint will be obtained in the case of a connection of polyimide and silicon, when the polyimide is subjected to a plasma-induced reaction with $H_2O$ and when the silicon is subjected to a plasma-induced reaction with $Cl_2$. If a wafer provided with a polyimide layer is to be connected to a wafer provided with a thermal oxide layer, the connection can be carried out either without any pretreatment of the thermal oxide or after the modification of the thermal oxide by a plasma-induced reaction with $Cl_2$.

In the following, a special preferred embodiment of the method according to the present invention for permanently connecting silicon wafers by means of a polyimide layer will be described.

First the two silicon wafers to be connected are provided.

Subsequently, polyimide in the form of a liquid precursor is applied by spinning to a main surface of one of the wafers to be connected. Following this, a temperature step above 200° C. is carried out so as to cause an imidization reaction. When this imidization reaction takes place, each polyimide precursor molecule expels two $H_2O$ molecules. Subsequently, a cyclization up to 400° C. is carried out in a nitrogen-flushed furnace so as to expel the condensed water from the polyimide film completely. Such a fully cyclized polyimide layer is temperature resistant up to more than 500° C. The above-described condensation reaction makes it impossible to use the soft, not fully imidized polyimide film as a conventional adhesive joint.

As a result of the above-described treatment of one of the wafers to be connected, one wafer having a polyimide layer and one wafer without such a polyimide layer have now been obtained. The wafer provided with the polyimide layer is introduced into an HF discharge chamber together with water. Following this, the HF plasma is ignited. The parameters for the plasma-induced reaction are as follows: pressure range: 0.1–1.0·10² Pascal; $H_2O$ flow: 0.1–1.0 ml/min; HF power: 100–500 W based on an 8" area; the expression 8" area refers to the area acted upon by the plasma, i.e. a round area having a diameter of 20.32 cm (8"). Hence, a power density of approx. 0.3 W/cm² and approx. 1.6 W/cm² is obtained. A round wafer having a diameter of 15 cm can, for example, be used.

While acted upon by the plasma-induced reaction, the wafer is located on the respective coupling-in electrode of the HF discharge chamber, i.e. in the so-called RIE mode (RIE=reactive ion etching). After the end of the process, the wafer is removed from the HF discharge chamber in the case of the preferred embodiment of the method according to the present invention and is then rinsed immediately in deionized water (DI water) for removing possibly existing particles on the one hand and for saturating residual, non-saturated bonds with OH groups on the other. The pretreatment of the wafer provided with the polyimide layer is then finished.

In the following, the pretreatment of the wafer having no polyimide layer provided thereon will be described. The wafer is introduced in an HF discharge chamber together with chlorine ($Cl_2$). Following this, the HF plasma is ignited. The plasma-induced reaction takes place under the following parameters: pressure range: 0.1–1.0·10² Pascal; $Cl_2$ flow: 10–200 ml/min (10–200 sccm; sccm=cubic centimetres per minute under standard conditions, i.e. room temperature and standard pressure); HF power: 100–500 W (8" area;→power density between 0.3 W/cm$^2$ and 1.6 W/cm$^2$). The wafer is again located on the coupling-in electrode of the HF discharge chamber in the so-called RIE mode. After the end of the plasma-induced reaction, the wafer is removed from the HF discharge chamber and, in the case of the embodiment described, it is rinsed immediately in deionized water. Furthermore, the side that has been modified with chlorine is treated with hydrolyzed triethoxysilylpropanamine in the case of the preferred embodiment. After this treatment, the preparatory treatment of the second wafer has been finished.

As the last method step, the two wafers are then placed one on top of the other so as to connect them. For this purpose, the superimposed wafers are heated to 400° C. e.g. within a period of 30 minutes to 4 hours. A permanent bonding joint between the two wafers is obtained in this way.

As an alternative to the above-described method, the wafer provided with the polyimide layer can also be connected to a wafer provided with an SiO$_2$ layer as the layer to be connected. In this case, the SiO$_2$ layer can be treated in the same way as described above with regard to the second silicon wafer. It is, however, also possible to connect the SiO$_2$ layer directly to the modified polyimide layer.

Hence, the present invention provides a method for connecting a first and a second silicon wafer by means of a polyimide layer, the strength of the connection area exceeding even the mechanical strength of the silicon wafers. The surface treatment according to the present invention will improve wetting in all cases, with the resultant advantage that the particle load of additional process steps can be reduced to the existing deionization water basin specification. In addition, the surface polarity matches the adhesion promoter for polyimide in the case of the method according to the present invention.

What is claimed is:

1. A method of connecting a first and a second silicon wafer, comprising the following steps:
    a1) providing the first silicon wafer with a fully cured polyimide layer on a main surface thereof;
    b1) causing a plasma-induced reaction to take place between the polyimide layer and water so as to make a surface of the polyimide layer, which is to be connected to the second silicon wafer, hydrophilic;
    c1) causing a plasma-induced reaction to take place between a main surface of the second silicon wafer, which is to be connected to the polyimide layer, and chlorine so as to make the main surface of the second silicon wafer hydrophilic;
    d1) treating the main surface of the second silicon wafer, which is to be connected to the polyimide layer, with hydrolyzed triethoxysilylpropanamine so as to produce amino groups on the main surface of the second silicon wafer; and
    e1) connecting the first and second silicon wafers by joining together the main surface of the second silicon wafer to be connected and the main surface of the polyimide layer to be connected while heat is being supplied for a specific period of time.

2. A method according to claim 1, wherein the respective surfaces are joined together at a temperature of 350° to 450° for a period from 30 minutes to 4 hours.

3. A method according to claim 1, comprising after step b1) the additional step of rinsing the polyimide layer with deionized water.

4. A method according to claim 1 wherein step a1) the polyimide in the form of a liquid precursor is applied by spinning to the main surface of the first silicon wafer and is then subjected to a temperature treatment.

5. A method according to claim 1 wherein the silicon wafer to be treated is located on a respective coupling-in eledrode of a HF discharge chamber while being acted upon by the plasma-induced reaction.

6. A method according to claim 1, comprising after the step c1) the additional step of rinsing the second silbon wafer with deionized water.

7. A method according to claim 1, wherein step c1) is carried out at a pressure of 0.1–1.0×10$^2$ Pascal, a Cl$_2$ flow of 10–200 ml/min and an HF power density in the range of 0.3 W/cm$^2$ to 1.6 W/cm$^2$ in an HF discharge chamber.

8. A method according to claim 1, wherein step b1) is carried out at a pressure of 0.1–1.0×10$^2$ Pascal, a H$_2$O flow of 0.1–1 ml/min and an HF power density in the range of 0.3 W/cm$^2$ to 1.6 W/cm$^2$ in an HF discharge chamber.

9. A method of connecting a first and a second silicon wafer, comprising the following steps:
    a2) providing the first silicon wafer with a fully cured polyimide layer on a main surface thereof;
    b2) A causing a plasma-induced reaction to take place between the polyimide layer and water, so as to make a surface of the polyimide layer, which is to be connected to the second silicon wafer, hydrophilic;
    c2) forming an SiO$_2$ layer on the main surface of the second silicon wafer;
    d2) causing a plasma-induced reaction between the SiO$_2$ layer and chloride;
    e2) treating the SiO$_2$ layer with hydrolyzed triethoxysilylpropanamine so as to produce amino groups on a main surface of the SiO2 layer to be connected to the polyimide layer; and
    f2) connecting the first and second silicon wafers by joining together the main surface of the SiO$_2$ layer to be connected and the main surface of the polyimide layer to be connected while heat is being supplied for a specific period of time.

10. A method according to claim 9, comprising after the step d2) the additional step of rinsing the SiO$_2$ layer with deionzed water.

11. A method according to claim 9, wherein step d3) is carried out at a pressure of 0.1–1.0×10$^2$ Pascal, a Cl$_2$ flow of 10–200 ml/min and an HF power density in the range of 0.3 W/cm$^2$ to 1.6 W/cm$^2$ in an HF discharge chamber.

12. A method according to claim 9, wherein step b2) is carried out at a pressure of 0.1 1.0×10$^2$ Pascal, an H$_2$O flow of 0.1–1 ml/min and an HF power density in the range of 0.3 W/cm$^2$ to 1.6 W/cm$^2$ in an HF discharge chamber.

13. A method according to claim 9, wherein the respective surfaces are joined together at a temperature of 350° to 450° for a period from 30 minutes to 4 hours.

14. A method according to claim 9, comprising after step b2) the additional step of rinsing the polyimide layer with deionized water.

15. A method according to claim 9, wherein, in step a2) the polyimide in the form of a liquid precursor is applied by spinning to the main surface of the first silicon wafer and is then subjected to a temperature treatment.

16. A method according to claim 9, wherein the silicon wafer to be treated is located on a respective coupling-inelectrode of a HF discharge chamber while being acted upon by the plasma-induced reaction.

* * * * *